(12) United States Patent
Zhang et al.

(10) Patent No.: US 8,747,092 B2
(45) Date of Patent: Jun. 10, 2014

(54) FAST NANOIMPRINTING APPARATUS USING DEFORMALE MOLD

(75) Inventors: Wei Zhang, Newtown, PA (US); Hua Tan, Princeton Junction, NJ (US); Lin Hu, Livingston, NJ (US); Stephen Y. Chou, Princeton, NJ (US)

(73) Assignee: Nanonex Corporation, Monmouth Junction, NJ (US)

( * ) Notice: Subject to any disclaimer, the term of this patent is extended or adjusted under 35 U.S.C. 154(b) by 108 days.

(21) Appl. No.: 13/011,844

(22) Filed: Jan. 21, 2011

(65) Prior Publication Data

US 2011/0180965 A1    Jul. 28, 2011

Related U.S. Application Data

(60) Provisional application No. 61/297,398, filed on Jan. 22, 2010.

(51) Int. Cl.
  *B29C 59/16*  (2006.01)
  *B29C 70/44*  (2006.01)
  *B29C 35/08*  (2006.01)
  *B29C 43/10*  (2006.01)

(52) U.S. Cl.
  USPC ........ 425/150; 425/385; 425/174.4; 425/139; 425/149; 425/389; 425/405.1; 425/388; 264/293; 264/40.1; 264/40.5; 264/496

(58) Field of Classification Search
  USPC .............. 425/385, 174.4, 139, 149, 150, 389, 425/405.1, 388; 264/293, 40.1, 40.5, 496
  See application file for complete search history.

(56) References Cited

U.S. PATENT DOCUMENTS

| | | | |
|---|---|---|---|
| 7,137,803 B2 * | 11/2006 | Chou | 425/405.1 |
| 2005/0275125 A1 * | 12/2005 | Kawakami et al. | 264/40.5 |
| 2007/0114686 A1 * | 5/2007 | Choi et al. | 264/2.7 |
| 2007/0190200 A1 * | 8/2007 | Cherala et al. | 425/385 |
| 2007/0228589 A1 * | 10/2007 | Choi et al. | 264/39 |
| 2008/0204684 A1 * | 8/2008 | Cho et al. | 355/53 |

* cited by examiner

*Primary Examiner* — Joseph S Del Sole
*Assistant Examiner* — Lawrence D Hohenbrink, Jr.
(74) *Attorney, Agent, or Firm* — Polster Lieder

(57) ABSTRACT

The invention disclosed apparatuses and methods to do nanoimprint lithography using a deformable mold. Generally, the apparatus has a chamber with a transparent section on its top wall, which is capable of vacuuming and pressurizing. The deformable mold fixed firmly onto a hollow mold holder around its full periphery is attached to top inner surface of the chamber and positioned underneath the transparent section. The central area of the mold is freely accessible from underneath through the opening of the mold holder. An enclosed volume referring to mold mini-chamber is formed between the mold/holder and top wall of the chamber. Inside chamber, a stage assembly is installed. A chuck to vacuumly hold a substrate is mounted on top of the stage assembly. At beginning of the imprinting, the substrate with a layer of resist is positioned underneath the mold at a predetermined gap between them. Then, the substrate is moved up to contact with the mold either under vacuum or under atmosphere. The substrate and mold may be pressed further by introducing higher pressure inside the chamber. After consolidating the resist, the substrate is separated from the mold by either direct pull-down enabled by stage movement or deforming the mold enabled by differential pressure between the mold mini-chamber and the bulk volume of the chamber, or mixing of both.

22 Claims, 7 Drawing Sheets

FAST NANOIMPRINTING APPARATUS USING DEFORMALE MOLD

CROSS-REFERENCE FOR RELATED APPLICATIONS

This application claims the benefit of U.S. Provisional Application Ser. No. 61/297,398 filed on Jan. 22, 2010, which is incorporated herein by reference.

STATEMENT REGARDING FEDERALLY SPONSORED RESEARCH

This invention was made with Government support under contract W31P4Q-06-C-0104 awarded by the Defense Advanced Research Projects Agency (DARPA). The Government has certain rights in the invention.

FIELD OF INVENTION

This invention relates to methods and apparatus for imprint lithography. It is particularly useful for providing fast replication of patterns of a mold having microscale or nanoscale features by imprint lithography.

BACKGROUND OF THE INVENTION

Nanoimprint lithography, also often called imprint lithography, is capable of replicating patterns on a pre-made mold as small as several nanometers. The pre-made mold has extruded areas and recessed areas on its replication surface, which constitute patterns of various shapes and sizes. The mold was typically made by a patterning step using electron beam lithography (EBL) or mixing of EBL and optical lithography, and, a follow-up etching step using reactive ion etching (RIE) to create the patterns. Nanoimprint lithography starts from applying a volume of polymer onto a substrate by either spinning or dispensing. The polymer is either flowable in ambient temperature, or, from rigid to deformable or flowable by thermally heating, Then, the pre-made mold is positioned to contact with the substrate. After that, the mold is pressed against the substrate. If the polymer is in liquid in ambient temperature, pressing the mold against the substrate will force the surface extrusion areas on the mold replication surface to go into the layer of the polymer. If the polymer is rigid in ambient temperature, a thermally heating step is conducted prior to the contact, after the contact but before the pressing, or during the pressing to make the polymer deformable or flowable. Thus, pressing the mold against the mold is able to force the surface extrusion areas on the mold replication surface to go into the layer of the polymer. When the extruded areas completely go into the layer of the polymer, the polymer transits from deformable or flowable into rigid by UV radiation, thermally heating or thermally cooling depending on types of the polymer. At last, the mold is released from the substrate while the layer of the polymer attaches to the substrate. To prevent the polymer from sticking to the mold, a very thin release coating may be deposited on the replication surface of the mold. Typical release coating included surface release surfactant and per-fluoro polymer deposited by CVD. After the substrate is separated from the mold, the extrusion areas on the mold surface is corresponding to the recessed areas in the polymer layer. Therefore, a reverse-tone replication of the patterns on the mold is formed onto the polymer film on the substrate. The polymer may be a thermo-plastic polymer or curable temperature. A thermo-plastic polymer transits from rigid to deformable or flowable when being heated above its glass transition temperature, and, vice versus when is cooled below its glass transition temperature. A curable polymer is deformable or flowable originally, and transit to rigid when being heating to curing temperature for thermo-set type and being cured under UV exposure for UV-curable type. When alignment is needed, the mold is aligned with the substrate through a set of matching align markers prior to the contact. Previously, electron beam lithography is very slow to write nanoscale patterns. It is unlikely to use it for mass production of nanoscale devices. Nanoimprint lithography is able to replicate whole area of patterned surface of the pre-made mold onto the substrate by one cycle of the process. It can dramatically increase the efficiency of patterning nanoscale features. Because the mold is repeatedly used for many cycles of imprinting, the high cost of using electron beam lithography to make the mold is averaged into these many imprints. Nanoimprint lithography delivers a practical method to produce nanoscale devices at low cost.

Since its invention in 1995 by Stephen Y. Chou (referring to U.S. Pat. No. 5,772,905), nanoimprint lithography has successfully demonstrated its capability of replicating a feature as small as 5 nm. Meanwhile, many research works were spent on developing resists for imprinting, mold making techniques, mold release coating for clean separation, and apparatus to do imprinting. In overall, nanoimprint lithography has evolved into being a widely used technology for research laboratories, but not reached a stage ready to meet much higher requirements of industrial use. One of the critical improvements needed by industrial use is imprint apparatus with high throughput and overlay accuracy.

Fast nanoimprint apparatus is highly demanded by semiconductor industry to use this technology to manufacture nano-scale device products. Prior to the invention, the apparatus of nanoimprint lithography conducted aligning and contacting the mold with the substrate and pressing the mold against the substrate on two different sites within frame of the apparatus. Separating the mold from the substrate was often conducted on either one site of them or a third site. This basic design approach demanded to transfer the contacted mold/substrate set among these sites to finish a full cycle of operation. Thus, throughput of the apparatus, which is defined as time consumption to finish a cycle of imprinting, is severely degraded by time cost of transferring among these different sites. Furthermore, the internal transferring increases mechanical complexity of the apparatus and potentially introduces mechanical failure during operation. An apparatus capable of completing a full cycle of imprinting process on one site within its frame limit will potentially achieve much higher throughput and reliability.

BRIEF SUMMARY OF THE INVENTION

The invention disclosed apparatuses and methods to do nanoimprint lithography using a deformable mold. Generally, the apparatus has a chamber with a transparent section on its top wall, which is capable of vacuuming and pressurizing. The deformable mold fixed firmly onto a hollow mold holder around its full periphery is attached to top inner surface of the chamber and positioned underneath the transparent section. The central area of the mold is freely accessible from underneath through the opening of the mold holder. An enclosed volume referring to mold mini-chamber is formed between the mold/holder and top wall of the chamber. Inside chamber, a stage assembly is installed. A chuck to vacuumly hold a substrate is mounted on top of the stage assembly. At beginning of the imprinting, the substrate with a layer of resist is positioned underneath the mold at a predetermined gap between them. Then, the substrate is moved up to contact with the mold either under vacuum or under atmosphere. The substrate and mold may be pressed further by introducing higher pressure inside the chamber. After consolidating the resist, the substrate is separated from the mold by either direct pull-down enabled by stage movement or deforming the mold enabled by differential pressure between the mold mini-chamber and the bulk volume of the chamber, or mixing of both.

BRIEF DESCRIPTION OF THE DRAWINGS

The features, nature and advantages of the invention will be more clearly understood by consideration of the illustrative embodiments now to be described in detail in connection with the accompanying drawing. In the drawing.

It is to be understood that these drawings are for purposes of illustrating the concept of the invention and are not to scale.

DETAILED DESCRIPTION OF THE INVENTION

The descriptions assume that UV curable imprint is conducted if it is not clearly identified and UV curable imprint is used as example. However, the invention does not limit for UV curable imprint and also apply for thermo-plastic imprint. An ordinary skilled in the art who is familiar with nanoimprint technology can easily revise the embodiment described in the invention to implement the concept of the invention for all type of imprinting.

Figure 1:
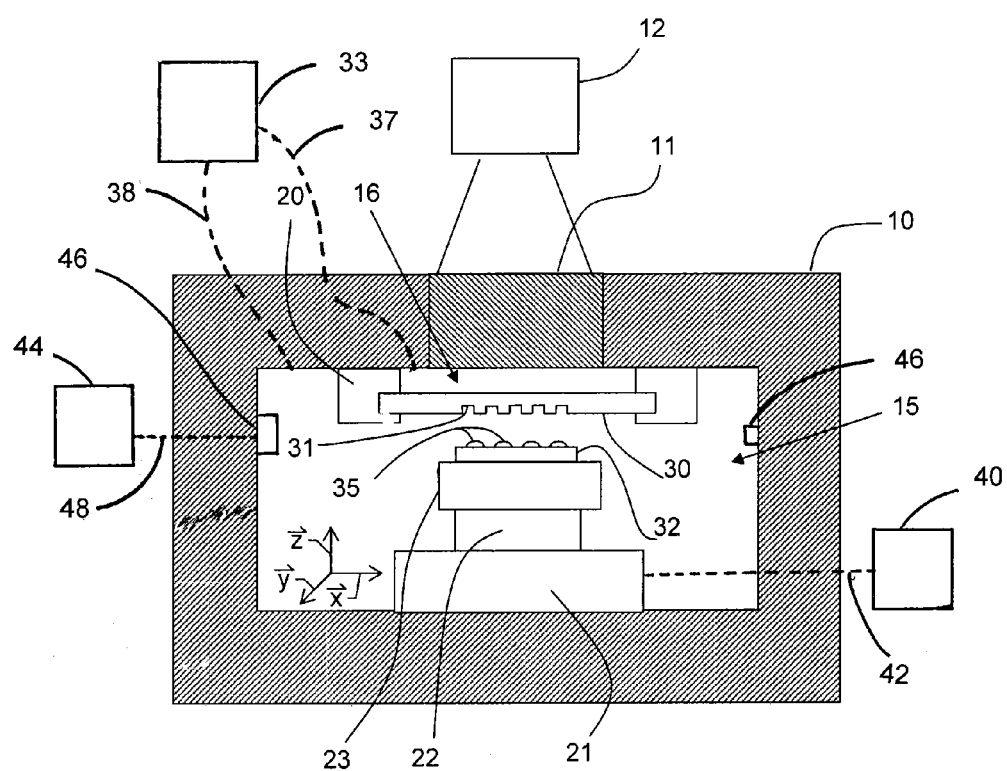
FIG. 1 is schematic drawing of the apparatus illustrating the invention.

In accordance with the concept of the invention, referring to FIG. 1, the apparatus has a chamber 10 that can achieve vacuum or pressure inside. The top wall of the chamber has a light passing through section 11. Section 11 could be a transparent window made of quartz or glass. The section is able to hold vacuum seal and built-up pressure inside the chamber during operation. Section 11 allows a UV light passing through to provide UV curing exposure for UV curable imprint and a visible light passing through to view inside of the chamber 10. For such purpose, a UV radiation source 12 is mounted outside chamber 10 and right above section 11. An alternative mounting for UV source 12 is to mount the source 12 elsewhere and use a plurality of minors to deflect UV light to pass through section 11. In case of doing thermal imprint, the UV radiation source 12 is replaced by heating lamp. Secondarily, section 11 allows viewing inside of the chamber 10 for alignment using microscopes, process monitoring using cameras or laser sensors, or both. A mold 30 for imprinting is firmly held around its full periphery against a mold holder 20 by using a mechanical clamp means. The mold holder 20 is hollow to permit a central patterned region 31 of mold 30 to be freely accessible from underneath side or both sides. The mold 30 may be installed on or uninstalled from the mold holder 20 for either replacement or cleaning. During operation, the mold holder 20 with the mold 30 installed is loaded into the chamber 10 and firmly attached to inner surface of top wall of the chamber 10. The mold holder 20 is positioned to have patterned region 31 exposable through section 11 and accessible from underneath. An enclosed volume named mold mini-chamber 16 is formed by body of mold holder 20, mold 30 and top inner surface of the chamber wall. Being contrast with mold mini-chamber 16, the rest bulky inner volume of the chamber 10 is referred to chamber volume 15. The chamber 10 is connected to a pressure pump 33 with pneumatic lines 37, 38 that independently control pumping or pressurizing of mold mini-chamber 16 and chamber volume 15, respectively. Therefore, both of them can be pumping to vacuum and pressurized and a differential pressure between them can be established when desired. Inside the chamber 10, a stage assembly 21 is mounted onto the bottom wall of the chamber 10. The stage assembly 21 is coupled to a stage assembly controller 40 via a control line 42 and at least contains a Z motion control in order to accomplish desired process of the apparatus. The stage assembly 21 may further contain X-Y motion controls in order to do alignment. A chuck 23 with vacuum grooves on its top surface is mounted on a leveler 22 which in turn is mounted on the stage assembly 21. Leveler 22 is to provide a limited adjustment of surface parallelism of the substrate 32. Leveler 22 may be removed when mechanical assembling accuracy of the apparatus is sufficient to accomplish desired process. A substrate 32 for imprinting is held on chuck 23 by vacuumly pumping through the vacuum grooves. The stage assembly 21 is either mechanically installed or capable of moving the substrate 32 within its X-Y travel ranges to superimpose the center of the substrate 32 with the center of patterned region 31 in X-Y plane. The substrate 32 may have a moldable material 35 applied on its side surface facing the mold 30 before imprint begins. The moldable material 35 could be a continuous film layer of imprinting resist spun on or a plurality of droplets of imprinting resist dispensed on. When the moldable material 35 is in form of a plurality of droplets before imprinting, the spatial relation of the distribution of the droplets could be a uniform matrix of equal spacing among adjacent droplets along one direction or multi directions, or an arbitrary matrix optimized for merging each to achieve desired imprinted patterns. In additional to these general demands for imprinting, the spatial relation is preferred to deliver an uniform and continuous contacting interface between the mold 30 and the substrate 32 during the imprint process of the apparatus.

Figure 2A:
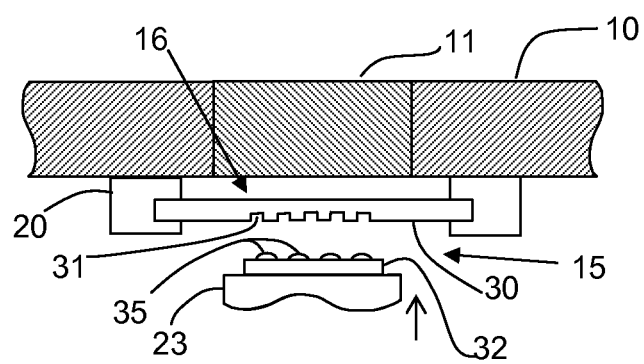
FIG. 2a-2d illustrates operation process of the apparatus illustrating the invention.

Imprint process of the apparatus is illustrated in serial drawings of FIGS. 2a, 2b, 2c, and 2d. Referring to FIG. 2a, mold holder 20 with mold 30 installed is loaded into chamber 10 and firmly attached to top plate of the chamber wall. Substrate 32 with moldable material 35 on its top surface is held against chuck 23 by pumping through the vacuum grooves and positioned beneath the opening of mold holder 20. At beginning of the imprint process of the apparatus, substrate 32 is positioned to a starting position which normally has a 1-2 millimeter gap between the substrate and the mold and the center of the substrate superimposing with the center of the mold.

Figure 2B:
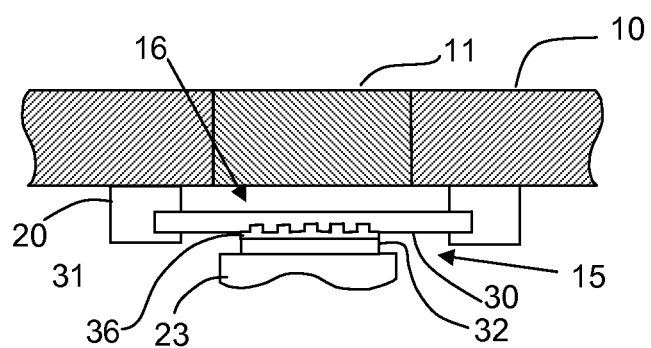
Figure 3:
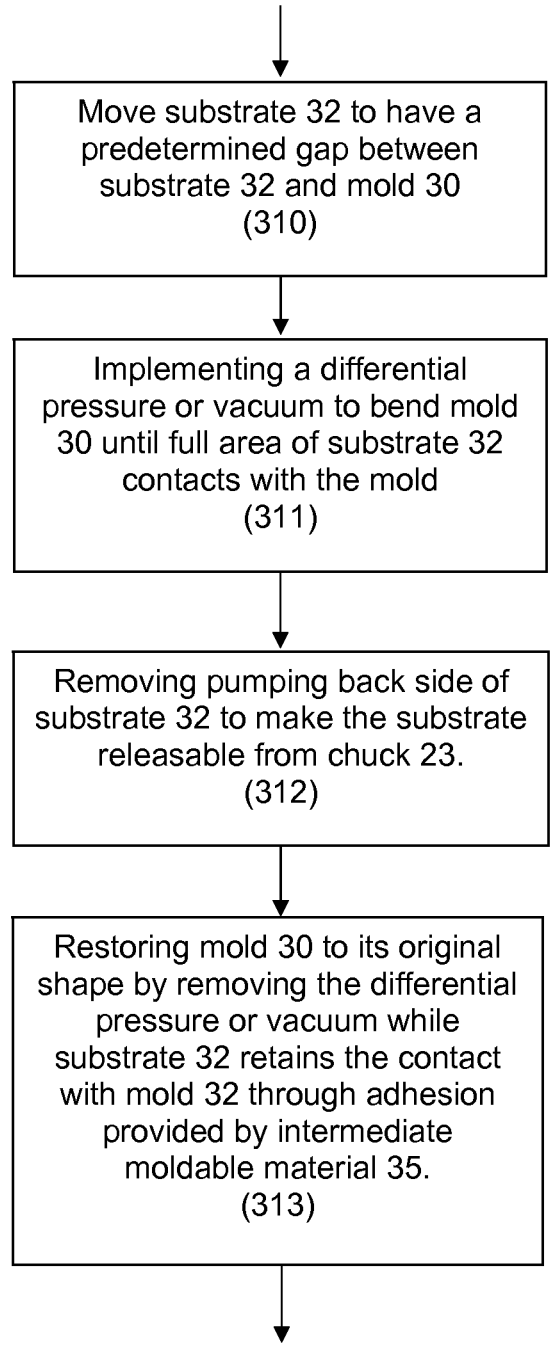
FIG. 3 is a flow chart to show a process to realize contacting step of the operation process.

Referring to FIG. 2b, next step of the imprint process is to pump chamber volume 15 and mold mini-chamber 16 to remove air. This pumping step facilitates to reduce trapped air defects of imprinted patterns. Aligning the substrate with the mold can be finished before the pumping or in the pumping. Normally, aligning the substrate 32 and the mold 30 is accomplished by positioning an align marker on the substrate 32 overlapping with a matching align marker on the mold 30 under microscopes. To prevent possible shift of the substrate 32 on chuck 23 during the pumping, the substrate 32 is moved up and contacts with the mold 30 under a controlled push by the stage assembly 21 before chamber volume 15 reaches a better vacuum than the vacuum grooves. Referring to FIG. 3, an alternative way to form the contact is realized by deforming the mold 30. Referring to step 310, the substrate 32 is positioned to have a predetermined gap between the mold 30 and the substrate 32. To control the gap at a predetermined distance, by way of example, a measurement subsystem 44 such as shown in FIG. 1, can include, by way of example, a laser/sensor combination assembly 46 located within the chamber 10 is coupled to the measurement subsystem 44 via communication line 48 to measure the distance between the molding surface of the mold 30 and the moldable surface of the substrate 32 and provides measurement data to the pressure pump 33 and/or the stage assembly controller 40. Then, referring to step 311, the mold 30 is deformed to press against the substrate 32 by implementing a differential vacuum or pressure between mold mini-chamber 16 and chamber volume 15. The center of the mold 30, where has the most significant deformation, firstly contacts with the substrate 32. As the differential vacuum or pressure increases, the contact expands from the center to periphery. At a specific differential vacuum or pressure, full area of the substrate 32 contacts with the deformed mold 30. The differential vacuum and pressure necessary to establish the full area contact is determined by major factors such as overall dimensions, peripheral clamping, body thickness and material of the mold 30, gap prior to deforming mold 30, and, overall dimensions of the substrate 32. During establishing the full area contact, moldable material 35 under press of the contact redistributes to form an intermediate layer of continuous film. Next, referring to step 312, pumping back side of the substrate through the vacuum grooves is removed to make the substrate releasable from the chuck 23. At last, referring to step 313, the mold is restored to its original shape by removing the differential vacuum or pressure while retaining the contact with the substrate 32. The intermediate moldable material 35 provides adhesion necessary to retain the contact between the mold 30 and the substrate 32.

Figure 4:
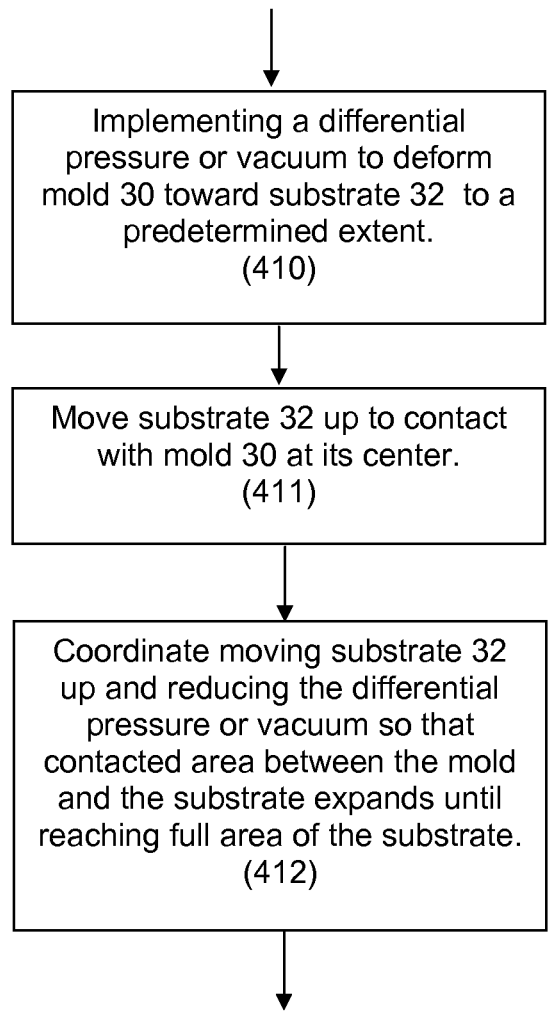
FIG. 4 is a flow chart to show an alternative process to realize contacting step of the operation process.

Referring to FIG. 4, another alternative way to accomplish the contact step of FIG. 2b is to deform the mold at a predetermined extent and move the substrate 32 up against the deformation. At first, referring to step 410, the mold 30 is deformed toward the substrate 32 to a predetermined extent by implementing a differential pressure or vacuum between mold mini-chamber 16 and chamber volume 15. The optimal condition for the predetermined extent of deformation is affected by substrate thickness variations and variations of surface parallelism between mold 30 and substrate 32. The predetermined extent of deformation prefers to have the center of the mold 30 deformed downward by 0.05-0.5 millimeters. Then, referring to step 411, substrate 32 is moved up to contact with deformed mold 30 at its center where maximum deformation occurs. After that, referring to block 412, moving substrate 32 up is coordinated with reducing the differential pressure or vacuum so that contacted area between the mold 30 and the substrate 32 expands accordingly until reaching full area of the substrate 32. The step can be realized by repeating small changes of moving the substrate 32 and reducing the differential pressure or vacuum. It is desired that the mold 30 is restored to its original shape when the full area contact is reached. The process of making the contact does not depend on adhesion provided by intermediate moldable material 35 and is able to squeeze any residual air out of interim region between the mold 30 and the substrate 32. Thus, it may be conducted at atmosphere without causing serious trapped air defects for imprinted patterns.

When the contact step of FIG. 2b is accomplished, the moldable material has been pressed lightly and redistributed to fill space between the mold and the substrate. For case of using very low viscosity moldable material, the press caused by the contact may be sufficient to imprint patterns of the mold into the moldable material. In order to guarantee quality of patterns imprinted, it may need to apply higher pressure press on the mold and the substrate than the contact.

Figure 2C:
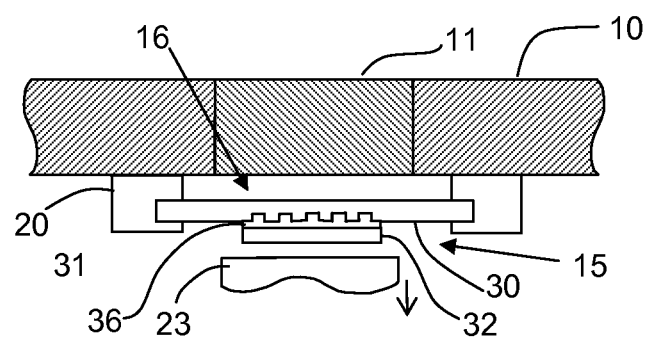

Referring to FIG. 2c, higher pressure press is applied on the mold and the substrate by filling mold mini-chamber 16 and chamber volume 15 with high pressure gas. Air Cushion Press (ACP) is realized during this step for imprinting. Details of Air Cushion Press are described by Stephen Y. Chou in U.S. Pat. No. 6,482,742 under a title of "Fluid Pressure Imprint Lithography", which is herein incorporated by reference. The ACP realized herein does not use a film or O-ring to seal edge in order for ACP to work properly. Instead, it depends on the prior contact and the intermediate moldable material to seal the contacting periphery of the mold and the substrate. This improvement of eliminating film or O-ring is very significant for the apparatus to achieve higher throughput and reliability. Chuck 23 may be moved away from contacting the back side of the substrate during this step so as not to degrade pressing uniformity of ACP. After reaching desired pressure for ACP, the moldable material redistributes to completely fill every space between the mold and the substrate, then, is consolidated to solid by a UV exposure through section 11. Finally, the high pressure gas for ACP is vented to atmosphere. So far, pattern formation of imprinting is completed. The substrate is ready for releasing from the mold.

Figure 2D:
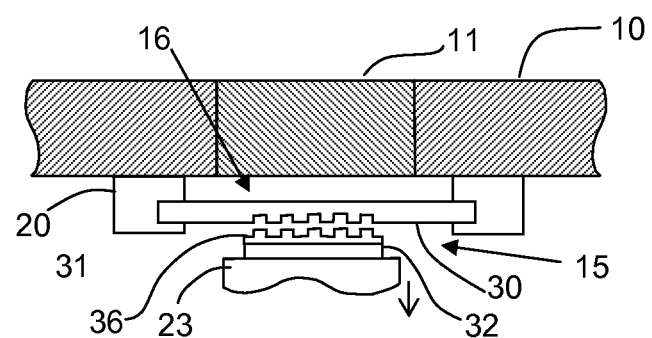
Figure 5:
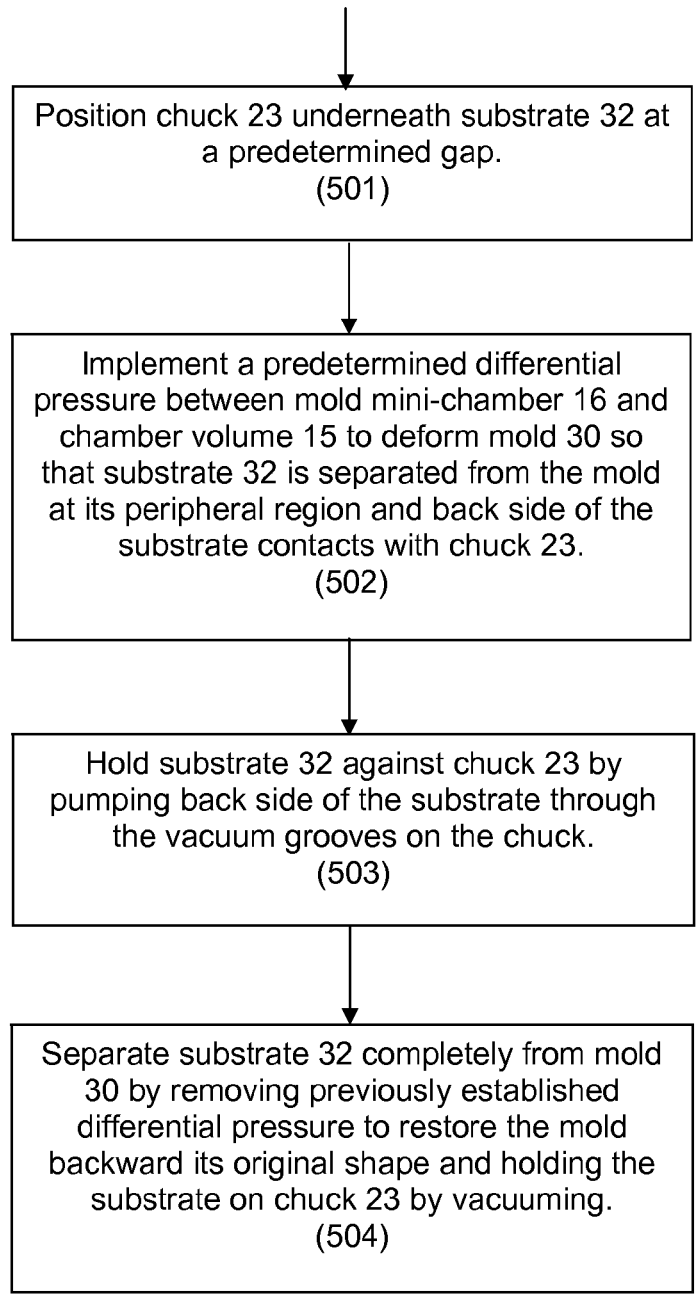
FIG. 5 is a flow chart to show a process to realize separation step of the operation process.

Referring to FIG. 2d, the substrate is separated from the mold. The separation can be realized by combining mold deformation and stage movement. FIG. 5 illustrates a way to separate the substrate from the mold. Referring to step 501 of FIG. 5, the separation starts from positioning chuck 23 underneath substrate 32 at a predetermined gap. Then, referring to step 502, a differential pressure between mold mini-chamber 16 and chamber volume 15 is introduced to deform the mold. As deformation is enlarged by increasing the differential pressure, substrate 32 loses contact from the mold starting from periphery and expanding toward center. Meanwhile, substrate 32 is lowered down until it is supported by chuck 23. The differential pressure reaches a predetermined value so that back side of substrate 30 completely contacts with chuck 23. By now, a significant peripheral region of the substrate is released from the mold and central region of the substrate is not yet. After that, referring to step 503, the substrate is held against chuck 23 by pumping back side of the substrate through the vacuum grooves on the chuck surface. Finally, referring to step 504, the established differential pressure is removed to restore the mold backward its original shape. Because the substrate is vacuumly held against the chuck, the remaining central area of the substrate is separated from the mold. The substrate stays on chuck 23 after the separation and the mold is returned to its starting status.

Figure 6:
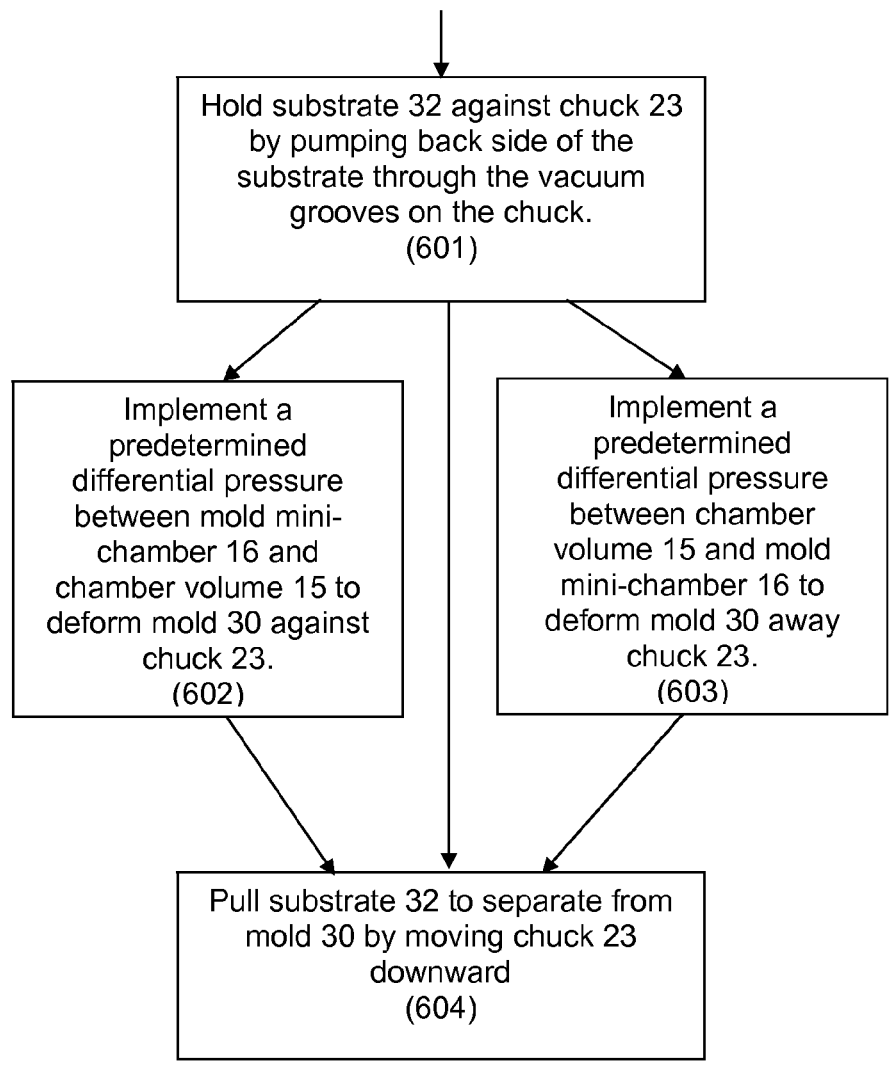
FIG. 6 is a flow chart to show alternative processes to realize separation step of the operation process.

Alternative ways to separate the substrate from the mold 30 are illustrated in FIG. 6. These ways share a common concept that use vacuuming to hold back side of the substrate 32 and pull it to separate using the stage assembly 21. This concept works for this scenario because the mold 30 is deformable. The mold 30 may be intentionally deformed to facilitate the separation. Referring to step 601 of FIG. 6, the separation starts from vacuumly holding back side of substrate 32 against top surface of chuck 23 by pumping through the vacuum groves on the chuck 23. If chuck 23 is away from the substrate 32, the chuck 23 is positioned to contact back side of the substrate 32 by the stage assembly 21 prior to the vacuumly holding. Referring to step 604, one way to separate is to pull substrate 32 downward by moving the stage assembly 21 down. Because the substrate 32 is held against the vacuum grooves on the chuck 23 and the mold 30 is deformable, at beginning of the pull, the mold 30 is deformed so that periphery of the substrate 32 is separated first. As the downward pulling is progressing, the separated region of the substrate 32 propagates from the firstly separated periphery inner ward the center. At end of the downward pulling, the substrate 32 is completely separated from the mold 30. To improve this separation process, referring to step 602 prior to step 604, a predetermined differential pressure is implemented between mold mini-chamber 16 and chamber volume 15 to deform the mold 30 against chuck 23. Presence of the differential pressure makes the mold 30 more easily deformable when the substrate 32 is pulled downward. Thus, the separation is improved to be more easy and reliable. The differential pressure is predetermined so that the mold 30 is not under risk of rupture when the substrate 32 is separated and the chuck 23 is moved away. Referring to step 603, it can also implement a reverse differential pressure between mold mini-chamber 16 and chamber volume 15 to deform the mold 30 away chuck 23. In such way, the mold 30 is more easily deformed away the substrate 32 to improve the separation when the substrate 32 is pulled downward. This reverse differential pressure is predetermined not to risk the mold 30 for any possible rupture when the substrate 32 is separated. For this case, a supporting surface could be specially designed on inner top wall of the chamber 10 to limit maximum reverse deformation of the mold 30. After the substrate 32 is separated from the mold 30, any differential pressure implemented previously is removed to restore the mold 30 to its original shape.

The mold used for the apparatus is deformable under a reasonable differential pressure between it two sides. The mold could be made of quartz, glass, polymer or metal. Obviously, to be used to do UV imprint, the mold has to have a reasonable UV transmission, which excludes using metal mold and prefers to use quartz, glass or UV transmissible polymer such as a specially made PMMA. If metal mold is used to do thermal imprint, the mold prefers to use Ni as mold material which has been widely used for compact disk (CD) manufacturing. To meet the criteria of deformable, overall dimensions, opening region on mold holder, and body thickness should be considered as a whole for the mold to be deformable under the process conditions of the apparatus. One example of the mold uses 8" diameter quartz or glass wafer with a substrate thickness 0.2-1 mm and has a 6" or 7" diameter circular opening region free to deform when it is installed on the mold holder. Another example of the mold uses 12" diameter quartz or glass wafer with a substrate thickness 0.2-2 mm and has a 10" circular opening region free to deform when it is installed on the mold holder. One more example of the mold uses 8" diameter Ni substrate with a thickness 0.1-1 mm and has a 6 or 7" diameter circular opening region free to deform when it is installed on the mold holder.

The improvements possessed by the invention are emphasized again herein. The apparatus embodiments described in the invention accomplish a full cycle of imprinting inside the chamber through a process essentially involving deforming the mold and positioning the substrate by the stage assembly. The speed to finish each step of the process is primarily decided by stage response and how fast to deform the mold. Using state-of-art stage technology, stage response can be very fast and capable of responding to requests of each step in seconds. By reducing effective volume of mold mini-chamber 16, deforming the mold is also very fast through adjusting gas pressure inside the mold mini-chamber relative to the chamber volume. Thus, the process of the apparatus to accomplish a full cycle of imprinting could be very fast. Furthermore, the chamber uses vacuum to eliminate possibility of trapping air between the mold and the substrate. The intrinsic Air Cushion Press (ACP) of the process provides very uniform imprinting force which is crucial to achieve the pattern fidelity required by manufacturing. Eliminating needs of using a film or o-ring to seal edge for proper ACP is also a significant improvement to have fast imprinting cycle and long-time reliable operation.

It is to be understood that the above described embodiments are illustrative of only a few of the many embodiments that can represent applications of the invention. Numerous and varied other arrangements can be made by those skilled in the art without departing from the spirit and scope of the invention.

What is claimed is:

1. An apparatus for imprinting a substrate with a mold, wherein the substrate has a moldable surface and the mold has a molding surface, comprising:
   a chamber;
   a mold fixture located inside said chamber and connected to said chamber, wherein the periphery of said mold is attached to said mold fixture during operation of the apparatus, said mold fixture comprises a chamber-interface seal at the interface between said mold fixture and said chamber and a mold-interface seal at corresponding interface between said mold fixture and said periphery, wherein the mold fixture has a body firmly attached to an inner surface of a top wall of the chamber, forming a mini-chamber by body of the mold fixture, the mold installed on the mold fixture, and the inner surface of the top wall of the chamber, a chamber volume being defined as the chamber minus the mini-chamber;
   a stage positioner located inside said chamber and connected to said chamber to dispose said substrate adjacent said mold in such way that said moldable surface faces said molding surface when both said substrate and said mold are present inside the chamber, wherein the stage positioner is configured to control the gap between said molding surface and said moldable surface when both said mold and said substrate are present inside the chamber; and
   a gas pressure source providing a first gas pressure to the chamber volume and a second gas pressure to the mini-chamber that is different from the first gas pressure, a provided differential pressure between the two sides of the mold provided to deform said molding surface transversely toward or away the moldable surface when both said mold and said substrate are present inside the chamber.

2. The apparatus of claim 1 further comprising a UV lamp located either outside or inside of said chamber to expose said moldable surface.

3. The apparatus of claim 1, further comprising a laser gap measuring subsystem coupled to the stage positioner and the pressure source to control the gap.

4. An apparatus for imprinting a substrate with a mold, wherein the substrate has a moldable surface and the mold has a molding surface, comprising:
   a chamber;
   a mold fixture having its central area hollowed, wherein the periphery of said mold is attached to said mold fixture during operation of the apparatus, said mold fixture comprises a chamber interface seal at the interface between said fixture and said chamber and a mold interface seal at corresponding interface between said fixture and said periphery, said mold fixture is located inside said chamber and is connected to said chamber, wherein the mold fixture having a body firmly attached to an inner surface of a top wall of the chamber, forming a mini-chamber by body of the mold fixture including the hollowed central area, the mold installed on the mold fixture, and the inner surface of the top wall of the chamber, a chamber volume being defined as the chamber minus the mini-chamber;

a stage positioner located inside said chamber and connected to said chamber to dispose said substrate adjacent said mold in such way that said moldable surface faces said molding surface when both said substrate and said mold are present inside the chamber, wherein the stage positioner is configured to control the gap between said molding surface and said moldable surface when both said mold and said substrate are present inside the chamber; and a gas pressure source providing a first gas pressure to the chamber volume and a second gas pressure to the mini-chamber that is different from the first gas pressure, a provided differential pressure between the two sides of the mold provided to deform said molding surface transversely toward or away the moldable surface when both said mold and said substrate are present inside the chamber.

5. The apparatus of claim 4 further comprising a UV lamp located either outside or inside of said chamber to expose said moldable surface.

6. The apparatus of claim 1, further comprising a laser gap measuring subsystem coupled to the stage positioner and the pressure source to control the gap.

7. The apparatus of claim 1 wherein said mold is made of quartz, glass, polymer or metal with its thinnest region having a thickness up to 2 mm.

8. The assembly of claim 1 wherein the chamber includes a connection to a plurality of external pneumatic lines coupled to the gas pressure source independently controlling second gas pressure of the mini-chamber and the first gas pressure of the chamber volume.

9. The assembly of claim 8 wherein the gas pressure source to deform said molding surface includes a differential pressure difference between the independently controlled second gas pressure of the mini-chamber as compared to the independently controlled first gas pressure of the chamber volume.

10. The assembly of claim 1 wherein the mold fixture has a central area hollowed, the central hollowed area forming a portion of the mini-chamber.

11. The assembly of claim 1 wherein the stage positioner is mounted on the bottom wall of the chamber and controls the gap in a controlled Z-axis motion, the stage positioner also configured to be controlled for movement in the X-axis and Y-axis to control a lateral positioning of the substrate relative to the mold attached to the mold fixture.

12. The assembly of claim 1, further comprising a controllable leveler mounted on the stage positioner providing a limited adjustment of surface parallelism of the substrate relative to the mold fixture.

13. The assembly of claim 12, further comprising a chuck having vacuum grooves on a top surface and being coupled to a vacuum pump, the chuck being mounted on the leveler means.

14. The assembly of claim 4 wherein the chamber includes a connection to a plurality of external pneumatic lines coupled to the gas pressure source independently controlling second gas pressure of the mini-chamber and the first gas pressure of the chamber volume.

15. The assembly of claim 14 wherein the gas pressure source to deform said molding surface includes a differential pressure difference between the independently controlled second gas pressure of the mini-chamber as compared to the independently controlled first gas pressure of the chamber volume.

16. The assembly of claim 1 wherein the stage positioner is mounted on the bottom wall of the chamber and controls the gap in a controlled Z-axis motion, the stage positioner also configured to be controlled for movement in the X-axis and Y-axis to control a lateral positioning of the substrate relative to the mold attached to the mold fixture, further comprising:
    a controllable leveler mounted on the stage positioner providing for a limited adjustment of surface parallelism of the substrate relative to the mold fixture; and
    a chuck having vacuum grooves on a top surface and being coupled to a vacuum pump, the chuck being mounted on the leveler means.

17. The assembly of claim 1 wherein the differential pressure provides for a deformation of the molding surface towards the moldable surface of the substrate to provide contact between the molding surface and the moldable surface.

18. The assembly of claim 1 wherein the differential pressure provides for a deformation of the molding surface away from the moldable surface of the substrate to separate the molding surface from the moldable surface after contact.

19. The assembly of claim 1 wherein the differential pressure provides for the contact between the molding surface and the moldable surface to seal a periphery of the molding surface against a periphery of the moldable surface without the use of a film or O-ring.

20. The assembly of claim 4 wherein the differential pressure provides for a deformation of the molding surface towards the moldable surface of the substrate to provide contact between the molding surface and the moldable surface.

21. The assembly of claim 4 wherein the differential pressure provides for a deformation of the molding surface away from the moldable surface of the substrate to separate the molding surface from the moldable surface after contact.

22. The assembly of claim 4 wherein the differential pressure provides for the contact between the molding surface and the moldable surface to seal a periphery of the molding surface against a periphery of the moldable surface without the use of a film or O-ring.

* * * * *

UNITED STATES PATENT AND TRADEMARK OFFICE
CERTIFICATE OF CORRECTION

PATENT NO.        : 8,747,092 B2
APPLICATION NO.   : 13/011844
DATED             : June 10, 2014
INVENTOR(S)       : Wei Zhang et al.

Page 1 of 1

It is certified that error appears in the above-identified patent and that said Letters Patent is hereby corrected as shown below:

In the Specification
In Column 3, line 54, replace "minors" with --mirrors--.

Signed and Sealed this
Twenty-second Day of December, 2015

Michelle K. Lee
*Director of the United States Patent and Trademark Office*